US011561255B2

(12) United States Patent
Abhishek et al.

(10) Patent No.: US 11,561,255 B2
(45) Date of Patent: Jan. 24, 2023

(54) SYSTEMS AND METHODS FOR DETECTING FAULTS IN AN ANALOG INPUT/OUTPUT CIRCUITRY

(71) Applicant: NXP USA, Inc., Austin, TX (US)

(72) Inventors: Kumar Abhishek, Bee Cave, TX (US); Xiankun Jin, Austin, TX (US); Srikanth Jagannathan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/231,642

(22) Filed: Apr. 15, 2021

(65) Prior Publication Data

US 2022/0334176 A1 Oct. 20, 2022

(51) Int. Cl.
*G01R 31/28* (2006.01)
*H03K 3/037* (2006.01)

(52) U.S. Cl.
CPC ......... *G01R 31/2882* (2013.01); *H03K 3/037* (2013.01)

(58) Field of Classification Search
CPC .......................... G01R 31/2882; H03K 3/037
See application file for complete search history.

(56) References Cited

U.S. PATENT DOCUMENTS

| 4,427,948 | A | 1/1984 | Rinaldi |
| 10,436,839 | B2 | 10/2019 | Meyer |
| 10,897,225 | B1* | 1/2021 | Strom ................. G06F 1/04 |
| 2009/0309611 | A1* | 12/2009 | Butler ............. G01R 19/16528 324/537 |
| 2015/0200666 | A1* | 7/2015 | Edelson ............. H03K 19/0002 326/59 |
| 2015/0241553 | A1 | 8/2015 | Gehrels et al. |
| 2019/0068191 | A1* | 2/2019 | Liu ................. H03K 19/018528 |
| 2019/0372561 | A1* | 12/2019 | TT ........................... H03K 5/19 |
| 2021/0223330 | A1* | 7/2021 | Yanamandra ............ H03K 5/24 |

OTHER PUBLICATIONS

Lu et al., "A New IDDQ Testing Scheme Employing Charge Storage BICS Circuit for Deep Submicron CMOS ULSI," Proceedings 1998 IEEE International Workshop on IDDQ Testing, 1998, 5 pages.
Hsu et al., "High Performance BICS Design for IDDQ Testing Application," 2007 IEEE Conference on Electron Devices and Solid-State Circuits, 2007, 4 pages.
Antonioli et al., "A High-speed IDDQ Sensor Implementation," Proceedings of the Ninth Asian Test Symposium, 2000, 6 pages.
Xinguang, Peng, "Fault Detection for Mixed Signal ICs By Current Integration," 1998 5th International Conference on Solid-State and Integrated Circuit Technology, 4 pages.
(Continued)

*Primary Examiner* — Akm Zakaria

(57) ABSTRACT

An integrated circuit includes an input/output (I/O) circuit configured to receive a first signal and a second signal and a fault detection circuit. The I/O circuit includes an I/O terminal, an I/O buffer, and a pull resistor having a first terminal coupled to the I/O terminal. The fault detection circuit is configured to determine whether a predetermined number of toggles of the first signal occurs while the second signal is held at a constant logic state, assert a fault indicator when the predetermined number of toggles occurs, and negate the fault indicator when the predetermined number of toggles does not occur.

15 Claims, 6 Drawing Sheets

(56) References Cited

OTHER PUBLICATIONS

Lechuga et al., "Built-in Dynamic Current Sensor for Hard-to-Detect Faults in Mixed-Signal ICs," Proceedings 2002 Design, Automation and Test in Europe Conference and Exhibition, 7 pages.
Ahmed et al., "Built-In-Current-Sensor for Testing Short and Open Faults in CMOS Digital Circuits," 2010 International Conference on Microelectronics, 4 pages.
Kwak et al., "Design of a CMOS Built-In Current Sensor for On-Line Current Testing," 2003 Proceedings, vol. 2, 5th International Conference on ASIC, 4 pages.

* cited by examiner

SYSTEMS AND METHODS FOR DETECTING FAULTS IN AN ANALOG INPUT/OUTPUT CIRCUITRY

BACKGROUND

Field

This disclosure relates generally to semiconductor devices, and more specifically, to fault detection in analog input/output circuitry.

Related Art

A system-on-a-chip (SOC) is a semiconductor integrated circuit device that includes processing cores, one or more memory devices, peripheral interfaces, and power management circuitry in one packaged device. Typically, SOCs perform functional self-tests such as Logical Built-In Self-Test (BIST), Memory BIST, and Analog BIST. Analog BIST checks analog circuitry such as analog-to-digital converters and voltage regulators, but only some of the circuitry is tested before running customer application code. However, during the self-test, most of the analog and input/output (I/O) circuits are safe stated, i.e., their functional controls are not exercised. For example, all the I/O circuits are disabled except those that are configured as input/outputs for the self-test.

Analog circuits often require precision trimming after fabrication. Trimming generally involves changing resistance values to change voltage or current levels. For example, trimming is often performed to cancel process variation among wafers to meet required voltage tolerances. As another example, multiple options may be fabricated into a single SOC, where one such option must be chosen based on a given customer's requirements. Selection of the desired option for each customer can be accomplished by trimming. Analog circuit trim controls are typically safe stated during BIST, however, leaving a hole in the defect coverage.

Some of the analog I/O interface signals are sometimes highly susceptible to failures in the field when the signals are routed over long distances because there are no critical timing issues associated with the signals. For example, it is common for signals that do not change very often, such as weak pull-up/pull-down circuits, trim bits, port controls, and I/O controls, to be routed over long distances since they are generated from a common logic place and routed to every I/O port, often covering the entire length and width of the SOC.

Accordingly, it is desirable to increase the capability to detect failures in analog I/O circuitry during built-in self-tests.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of the present invention disclosed herein are intended to detect failure patterns at the input/output (I/O) and analog input interface that may indicate a susceptibility to failure due to either malfunctioning software or backend routing. Activity monitors can be configured inside I/O and analog circuit modules to detect a stimuli pattern that is unexpected or unnecessary. The monitor circuits can run in the background throughout the life of a product in the field and help identify areas where remedial steps can be taken to improve reliability and restore full functionality. Alternatively, the monitor circuits can be gated by a mode indicator, such that when the mode indicator is set for a test mode, the fault indicator can be selectively asserted by the monitor circuitry based on one or more of the fault indicators, and when the mode indicator is not in test, the fault indicator can have a predetermined value, regardless of the values of one or more of the fault indicators. During burn-in tests, the output of the monitor circuits can indicate that a failure may be imminent, thus providing early fault warnings and allowing problems to be fixed before going into full production. The fault indicator for hundreds of I/O circuits can drive an existing output for analog I/O circuitry to an opposite state, thereby avoiding the need for additional I/O ports. Alternatively, a dedicated "Fault" output can be generated from each analog I/O fault detection circuit to observe the faults independently. Embodiments of the activity monitor/fault detection circuitry enhance the diagnostic coverage of analog I/O circuits, and can be used to improve safety metrics and to meet desired reliability and performance.

Figure 1:
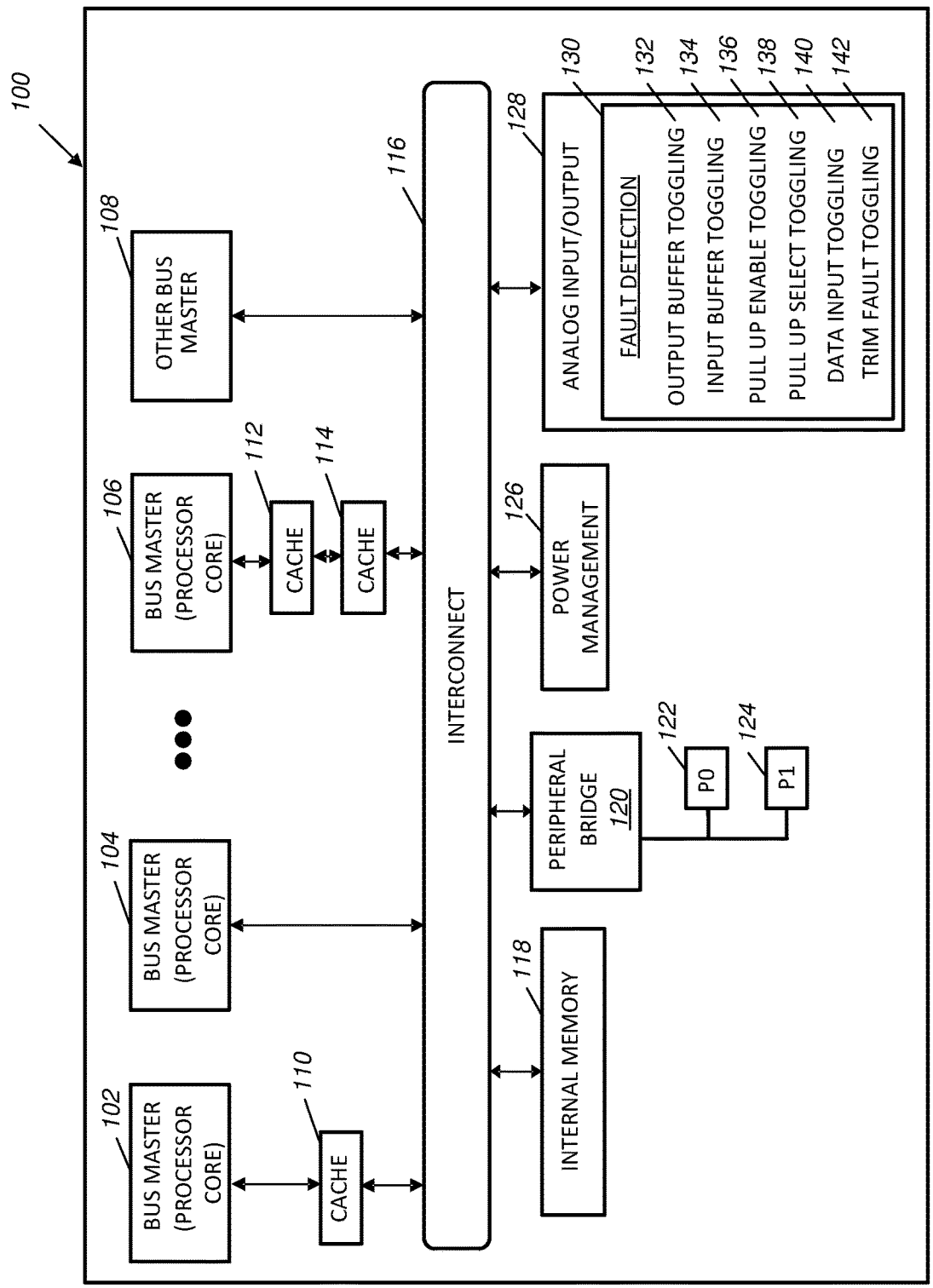
FIG. 1 illustrates a block diagram of components of a processing system capable of detecting defects in analog I/O circuitry in accordance with selected embodiments of the present invention.

FIG. 1 illustrates a simplified block diagram of components of processing system (also referred to as an integrated circuit) 100 capable of monitoring and detecting defects in analog I/O circuitry in accordance with selected embodiments of the present invention. Processing system 100 can include one or more bus masters in the form of processor cores 102, 104, 106, other bus masters 108 such as direct memory access controllers, one or more levels of cache memory 110, 112, 114 associated with one or more of the processor cores 102, 104, 106, interconnect 116, internal memory device 118, peripheral bridge 120 coupled to peripherals 122, 124, power management circuit 126, analog I/O circuitry 128 that includes fault detection or monitoring circuitry 130, and other components such as network ports (not shown). Fault detection circuitry 130 can include circuitry for detecting output buffer toggling 132, input buffer toggling 134, pull-up enabled toggling 136, pull-up selected toggling 138, data input toggling 140 and trim signal toggling 142 (therefore, each of these circuitries can be referred to as a fault detection circuit 132, a fault detection circuit 134, a fault detection circuit 136, a fault detection circuit 138, a fault detection circuit 140, and a fault detection circuit 142, respectively). Fault detection circuitry 130 can include circuitry to detect other unexpected conditions in analog I/O circuitry 128 in addition to or instead of those shown in FIG. 1.

Processing cores 102, 104, 106 include computer processor circuitry capable of performing functions that may be implemented as software instructions, hardware circuitry, firmware, or a combination of software, hardware and/or firmware. Operations and functions may be performed under the control of an operating system. One or more instances of software application code may be executed at the same time. Application code being executed by processing cores 102, 104, 106 may access data and instructions in memory device 118 via interconnect 116. Processing cores 102, 104, 106 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. In addition or in the alternative, processing cores 102, 104, 106 may be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, or an embedded processor. Any other type of bus master logic 108, such as a direct memory access controller, capable of initiating or responding to requests, may also be included in processing system 100.

Processing system 100 can also include one or more network ports (not shown) configurable to connect to one or more networks, which may likewise accessible to one or more remote nodes. The remote nodes can include other applications processors, devices or sensors that can exchange information with processing system 100.

Interconnect 116 routes requests and responses between bus masters 102, 104, 106, 108 and power management circuit 126, peripheral bridge 120, one or more internal memory devices 118, and analog I/O circuitry 128.

Peripheral bridge 120 is communicatively coupled to interconnect 116. Peripheral bridge 120 can include, for example, circuitry to perform power management, flash management, interconnect management, USB, and other PHY type tasks. A variety of peripheral devices 122,124 such as sensors, field programmable gate arrays, external integrated circuits, a mouse, keyboard, printer, display monitor, external memory drives, cameras, and lights, among others, can be coupled to processing system 100 via peripheral bridge 120.

Internal memory device 118 may include one or more volatile storage (or memory) devices such as random-access memory (RAM), dynamic RAM (DRAM), synchronous DRAM (SDRAM), static RAM (SRAM), or other types of volatile storage devices. In addition or in the alternative, internal memory device 118 may include non-volatile memory, such as read only memory (ROM), electrically erasable programmable ROM, flash memory, magnet RAM, resistive RAM, write once memory such as fuses, or the like. In whatever form, internal memory device 118 may store information including sequences of instructions that are executed by the processing device or any other device, information to configure processing system 100, and other data, instructions or information. For example, executable code and/or data, in including but not limited to an operating system, device drivers, firmware (e.g., input output basic system or BIOS), and/or applications can be loaded in the memory and executed by processor cores 102, 104, 106.

Power management circuit 126 can include a processor core and can access, memory, input/output (I/O), and peripheral components to be used to control various power modes such as normal operation, sleep or other power saving modes, and power down, as well as to supply proper levels of voltage to various components in processing system 100.

Analog I/O circuitry 128 can include various components such as power regulators, analog-to-digital converters, reference voltage circuits, input/output buffers and other circuits with electrostatic discharge protection, and fault detection circuit 130. Other suitable components may be included in analog and input/output circuitry 128.

Fault detection circuitry 130 can include circuitry to determine whether there are unexpected or faulty results from output buffers, input buffers, pull-up and pull-down devices, and analog trim control circuits. Defects may arise from open or short circuits on signal traces with long length. Sometimes the long signal traces may be routed in close proximity to another signal trace that, while shorter, may be quite active. The coupling of the two signal lines may cause a defect in the form of an open circuit to arise over time. One example is a trace for an internal reference clock trim signal being routed in close proximity to a trace for a test mode select signal. The test mode select signal can have high activity compared to the trim signal, which is usually set once during start up and remains constant during operation. The internal reference clock trim bit signal is typically safe stated during the self-test resulting in the signal not being tested and the defect not being discovered.

Figure 2:
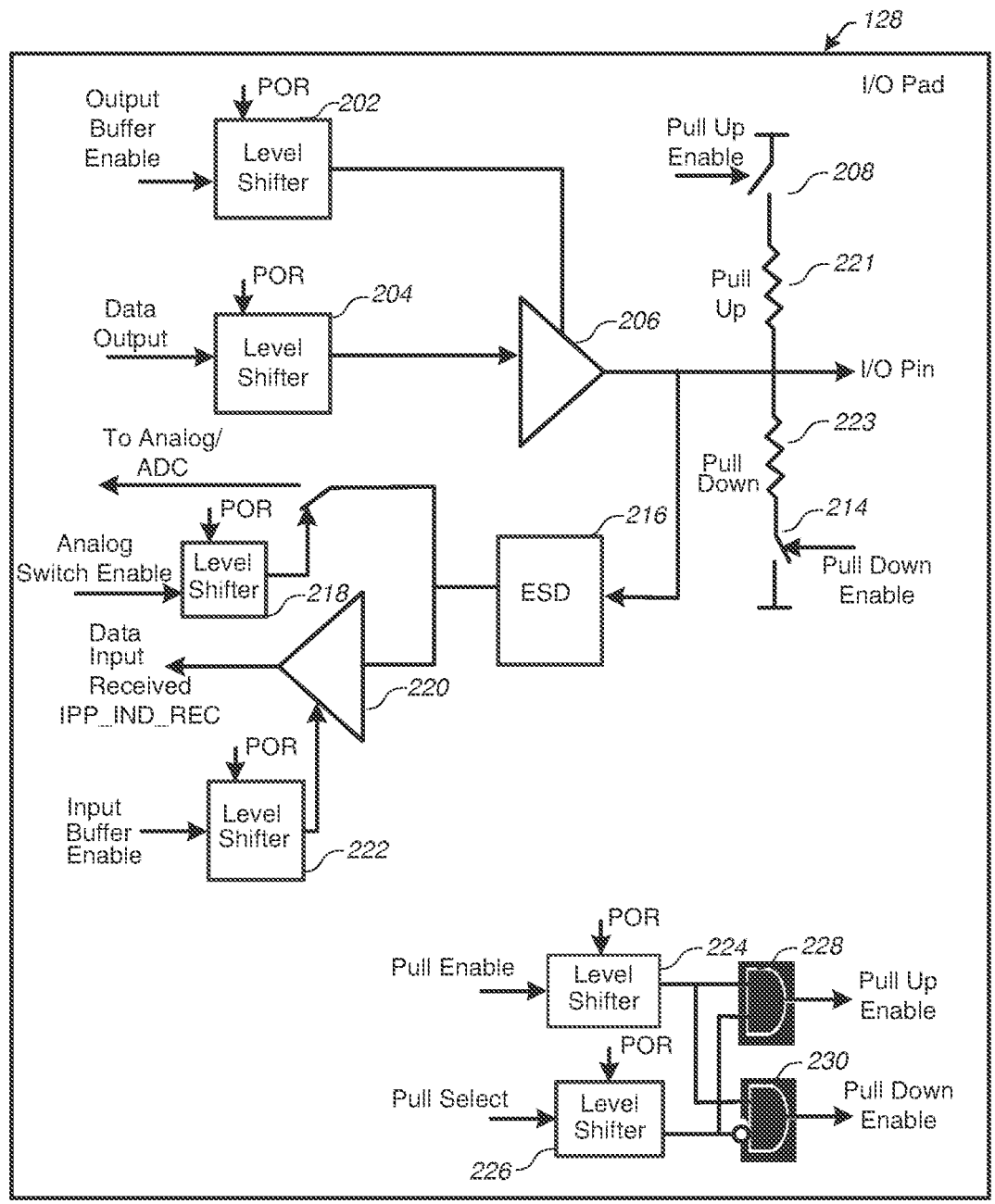
FIG. 2 illustrates a block diagram of analog I/O circuitry that may be implemented in the processing system of FIG. 1 in accordance with selected embodiments of the invention.

FIG. 2 illustrates a block diagram of analog I/O circuitry 128 that may be implemented in the processing system 100 of FIG. 1 in accordance with selected embodiments of the invention. Level shifter 202 includes a first input coupled to an output buffer enable signal and a second input coupled to a power on reset signal POR. An output of level shifter 202 is provided as a control input to output buffer 206. A second level shifter 204 includes a first input coupled to a data output signal and a second input coupled to the power on reset signal POR. The output of level shifter 204 is coupled to an input of output buffer 206. The output of output buffer 206 is coupled to an I/O pin of a packaged semiconductor device that includes processing system 100. Pull-up resistor 221 is coupled between switch 208 and the output of output buffer 206 to selectively allow controlled current flow from a supply voltage source to the I/O pin, depending on the status of a pull-up enable signal. Pull-down resistor 223 is coupled between switch 214 and the I/O pin to selectively control current flow from the I/O pin to ground, depending on the status of a pull-down enable signal. At the same time both resistors 221, 223 can hold the digital state of the I/O pin either High or Low, respectively.

Circuitry to generate the pull-up and pull-down enable signals include level shifter 224 with a first input coupled to a pull enable signal and a second input coupled to the power on reset signal POR. The output of level shifter 224 is provided to a first input of AND gate 228 and a first input of AND gate 230. Level shifter 226 includes a first input coupled to a pull select signal and a second input coupled to the power on reset signal POR. The output of level shifter 226 is provided to an inverting input of AND gate 230 and a second input of AND gate 228. The output of AND gate 228 is the pull-up enable signal and the output of AND gate 230 is the pull-down enable signal.

The output of output buffer 206 is provided as an input to electrostatic discharge (ESD) circuitry 216. Level shifter 218 includes a first input coupled to an analog switch enable signal and a second input coupled to the power on reset signal POR. The output of level shifter 218 can be used as a control input to a switch to selectively provide output of ESD circuitry 216 to an analog-to-digital converter (not shown). The output of ESD circuitry 216 and also be provided as an input to input buffer 220. Level shifter 222 includes a first input coupled to an input buffer enable signal and a second input coupled to the power on reset signal. Output of level shifter 222 is connected to control terminal of input buffer 220. The output of input buffer 220 is a data input received signal (IPP_IND_REC).

Defects in routing for I/O control signals, such as the output buffer enable OBE, input buffer enable IBE, pull-up enable PUE, and pull-up select PUS signals, can cause effects such as failed communication if a clock is running or no communication if clock trace is broken. Other effects can include incorrect general-purpose I/O behavior, bad memory transactions, failure in transactions that do not include error correction codes, failure in protocol handshakes, and failure in reset and power on pins. These types of defects are typically not covered as part as self-tests, but unexpected conditions caused by the defects can be detected by fault detection circuitry 130.

Table 1 shows examples of conditions that are not intended to occur in analog I/O circuitry 128. If such patterns are observed, the error may be due to software errors, or open/short circuits. The conditions can include detecting multiple toggling on the data input and the output buffer is not enabled, the pull select signal is toggling and the pull enable signal is not asserted, toggling is detected on the pull-up enable signal and the output buffer enable signal is asserted, the output buffer enable signal is toggling and the data input signal is not asserted, or when the input buffer enable signal is toggling and the output buffer enable signal is asserted.

TABLE 1

Unexpected Conditions In Analog I/O Circuitry

| Data Input to IO (IPP_DO) | Output Buffer Enable (OBE) | Input Buffer Enable (IBE) | Pull Enable (PUE) | Pull Select (1-pulled up 0-pulled down) |
|---|---|---|---|---|
| Toggling | 0 | NA | NA | NA |
| NA | NA | NA | 0 | Toggling |
| NA | 1 | NA | Toggling | NA |
| 0 | Toggling | NA | NA | NA |
| NA | 1 | Toggling | NA | NA |

Figure 3:
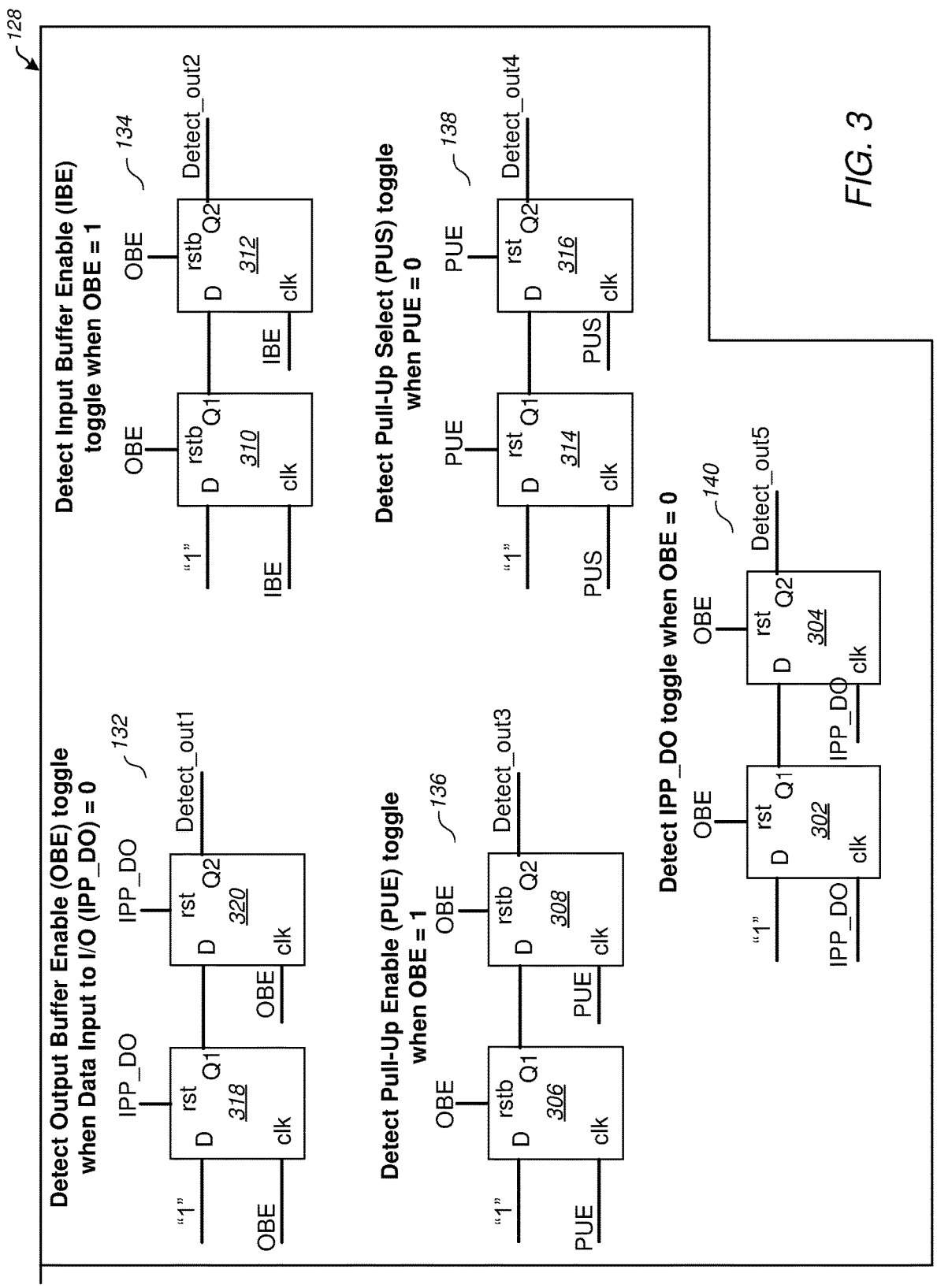
FIG. 3 illustrates a block diagram of defect test circuits for various analog I/O circuitry that may be implemented in the processing system of FIG. 1 in accordance with selected embodiments of the invention.

In order to detect the unexpected conditions, fault detection or monitoring circuitry 130 can be included in analog input/output circuitry 128. FIG. 3 illustrates examples of fault detection circuits 132-140 for analog I/O circuitry 128 that may be implemented in the processing system 100 of FIG. 1 in accordance with selected embodiments of the invention.

Fault detection circuit 132 detects toggling of the output buffer enable signal OBE when the data input to I/O signal is not asserted. Flip-flop 318 includes a data signal connected to a power supply ("1" denoting a HIGH) coupled to its data input, a clock input coupled to the output buffer enable signal OBE, and a reset input coupled to the data input to I/O signal IPP_DO. The output of flip-flop 318 is provided to the data input of flip-flop 320. The output buffer enable signal OBE is coupled to a clock input of flip-flop 320 and the data input to I/O signal IPP_DO is provided to the reset input of flip-flop 320. The output of flip-flop 320 is a first detect output signal (Detect_out1).

Fault detection circuit 134 detects toggling of the input buffer enable signal IBE when the output buffer enable signal OBE is asserted. Flip-flop 310 includes a data signal connected to a power supply ("1" denoting a HIGH) coupled to its data input, a clock input coupled to the input buffer enable signal IBE, and an inverted reset input coupled to the output buffer enable signal OBE. The output of flip-flop 310 is provided to the data input of flip-flop 312. The input buffer enable signal IBE is coupled to a clock input of flip-flop 312 and the output buffer enable signal OBE is provided to the inverted reset input of flip-flop 312. The output of flip-flop 312 is a second detect output signal (Detect_out2).

Fault detection circuit 136 detects toggling of the pull-up enable signal PUE when the output buffer enable signal OBE is asserted. Flip-flop 306 includes a data signal connected to a power supply ("1" denoting a HIGH) coupled to its data input, a clock input coupled to the pull-up enable signal PUE, and an inverted reset input coupled to the output buffer enable signal OBE. The output of flip-flop 306 is provided to the data input of flip-flop 308. The pull-up enable signal PUE is coupled to a clock input of flip-flop 308 and the output buffer enable signal OBE is provided to the inverted reset input of flip-flop 308. The output of flip-flop 308 is a third detect output signal (Detect_out3).

Fault detection circuit 138 detects toggling of the pull-up select signal PUS when the pull-up enable signal PUE is not asserted. Flip-flop 314 includes a data signal connected to a power supply ("1" denoting a HIGH) coupled to its data input, a clock input coupled to the pull-up select signal PUS, and a reset input coupled to the pull-up enable signal PUE. The output of flip-flop 314 is provided to the data input of flip-flop 316. The pull-up select signal PUS is coupled to a clock input of flip-flop 316 and the pull-up enable signal PUE is provided to the reset input of flip-flop 316. The output of flip-flop 316 is a fourth detect output signal (Detect_out4).

Fault detection circuit 140 detects toggling of the data input to I/O signal IPP_DO when the output buffer enable signal OBE is not asserted. Flip-flop 302 includes a data signal connected to a power supply ("1" denoting a HIGH) coupled to its data input, a clock input coupled to the data input to I/O signal IPP_DO, and a reset input coupled to the output buffer enable signal OBE. The output of flip-flop 302 is provided to the data input of flip-flop 304. The data input to I/O signal is coupled to a clock input of flip-flop 304 and the output buffer enable signal OBE is provided to the reset input of flip-flop 304. The output of flip-flop 304 is a fifth detect output signal (Detect_out5).

Figure 4:
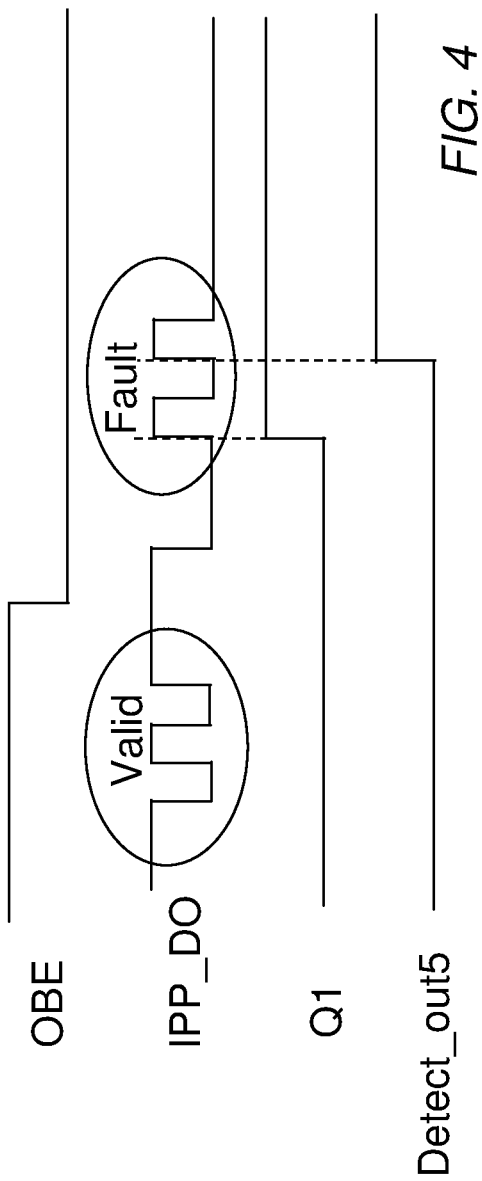
FIG. 4 illustrates an example of time history graphs for signals in an analog I/O fault detection circuit when an unintended condition is detected.

FIG. 4 illustrates an example of a time history for signals in fault detection circuit 140 when a fault is detected. When output buffer enable (OBE) signal is high, both flip-flops 302, 304 are in a reset state and their outputs Q1 and Detect_out5 remain low even when the data input to I/O signal IPP_DO toggles. The output buffer enable signal OBE changes to low, taking the flip flop out of reset state. When there is a first toggle on the data input to analog I/O signal IPP_DO, the output of first flip-flop 302 at Q1 goes high and the output of second flip-flop 304 at Q2 stays low. Upon the second toggle of the IPP_DO signal, the output of first flip-flop 302 at Q1 stays high and the output of second flip-flop 304, which is the Detect_out5 signal, also goes high. When the Detect_out5 signal is high, it can denote a fault condition since there were two toggles of the IPP_DO signal when the output buffer enable signal was not asserted. The number of toggles allowed before the fault is raised could be adjusted by adjusting the number of flip-flop stages. For example, three flip-flops could be included to require detection of three toggles before a potential fault is indicated, instead of just one toggle.

While the time history of signals for fault detection circuit 140 is shown as an example, it may be noted that fault detection circuits 132-138 may operate in a similar manner as fault detection circuit 140 using their respective input signals. The number of toggles required to set the Detect_out (n) signal can again depend on the number of flip-flop stages included in the fault detection circuit.

Figure 5:
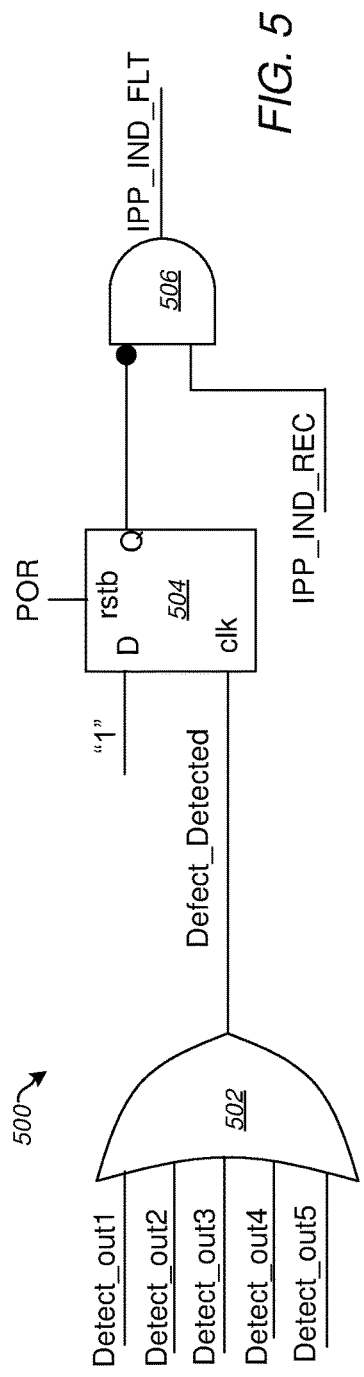
FIG. 5 illustrates a block diagram of a fault aggregation circuit that may be implemented in the processing system of FIG. 1 in accordance with selected embodiments of the invention.

FIG. 5 illustrates a block diagram of fault aggregation circuit 500 that may be implemented as part of fault detection circuitry 130 in processing system 100 of FIG. 1 in accordance with selected embodiments of the invention. Fault aggregation circuit 500 includes OR gate 502, flip-flop 504, and AND gate 506. OR gate 502 includes as many inputs as there are fault detection circuits 132-140. Each input of OR gate 502 receives the Detect_out(n) signal from a corresponding one of the fault detection circuits 132-140 shown in FIG. 3. The output of OR gate 502 is provided to a clock input of flip-flop 504. A data input of flip-flop 504 is connected to a power supply ("1" denoting a HIGH), and a reset input of flip-flop 504 receives the power on reset signal POR. The output of flip-flop 504 is provided to an inverting input of AND gate 506. A second, non-inverting input to AND gate 506 receives the data input received signal IPP_IND_REC from input buffer 220 in analog I/O circuit 128. The output of AND gate 506 is a data input fault indicator signal IPP_IND_FLT that can be provided to bus masters 102-108 (FIG. 1). Software in bus masters 102-108 can allow the fault indicator signal IPP_IND_FLT to override the data input indicator signal from an I/O pad and corrective measures can be taken when a fault is detected. Additional circuitry can be included to register which of the fault detection circuits 132-140 registered the fault. The fault can be latched until the next power on reset cycle. In such an implementation, the fault can be detected by blocking the functionality on IPP_IND_REC and software can detect no activity to generate a fault.

Figure 6:
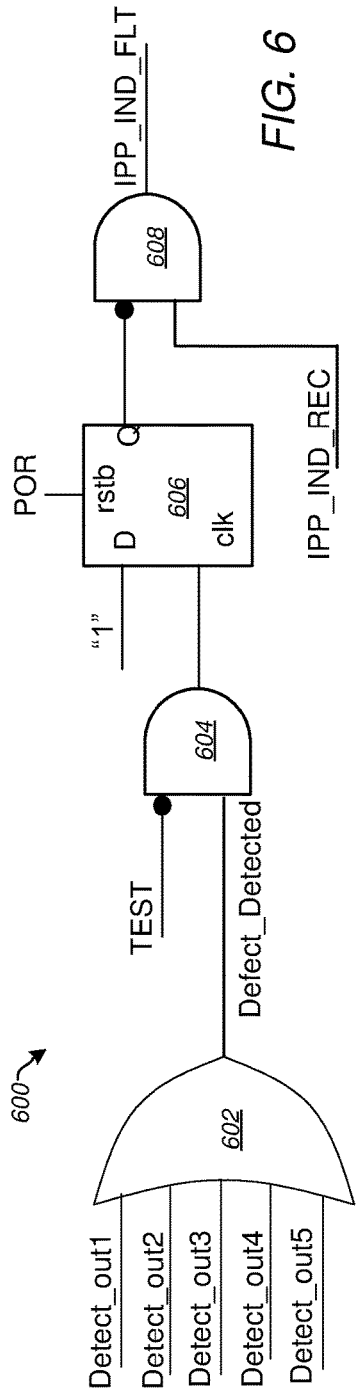
FIG. 6 illustrates a block diagram of another defect aggregation circuit that may be implemented in the processing system of FIG. 1 in accordance with selected embodiments of the invention.

FIG. 6 illustrates a block diagram of another defect aggregation circuit 600 (which may also be referred to as fault aggregation circuit 600) that may be implemented as part of fault detection circuitry 130 in processing system 100 of FIG. 1 in accordance with selected embodiments of the invention. Fault aggregation circuit 600 includes OR gate 602, AND gate 604, flip-flop 606, and AND gate 608. OR gate 602 includes as many inputs as there are fault detection circuits 132-140. Each input of OR gate 602 receives the Detect_out(n) signal from a corresponding one of the fault detection circuits 132-140 shown in FIG. 3. The output of OR gate 602 is provided to an input of AND gate 604. A second, inverting input of AND gate 604 receives a test signal that can be used to mask faults for scan patterns during test mode where the I/O control signals can have random activity. The TEST signal can be controlled directly from an input port and routed in the I/O ring. The output of AND gate 604 is provided to a clock input of flip-flop 606. A data input of flip-flop 606 is connected to a power supply ("1" denoting a HIGH), and an inverse reset input of flip-flop 606 receives the power on reset signal POR. The output of flip-flop 606 is provided to an inverting input of AND gate 608. A second, non-inverting input to AND gate 608 receives the data input received signal IPP_IND_REC from input buffer 220 in analog I/O circuit 128. The output of AND gate 608 is a data input fault indicator signal IPP_IND_FLT that can be provided to bus masters 102-108 (FIG. 1). Software in bus masters 102-108 can allow the fault indicator signal IPP_IND_FLT to override a data input indicator signal from an I/O pad and corrective measures can be taken when a fault is detected. Additional circuitry can be included to register which of the fault detection circuits 132-140 registered the fault. The fault can be latched until the next power on reset cycle. In such an implementation, the fault can be detected by blocking the functionality on IPP_IND_REC and software can detect no activity to generate a fault.

Figure 7:
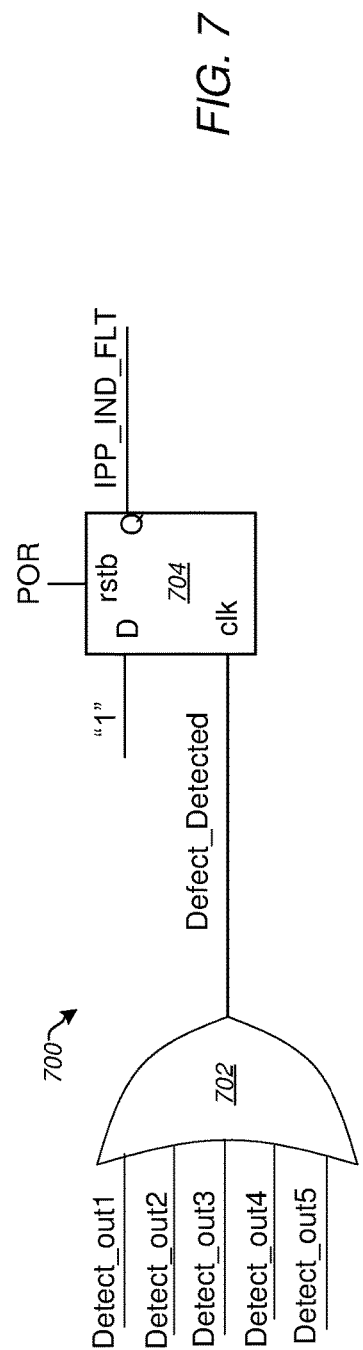
FIG. 7 illustrates a block diagram of yet another fault aggregation circuit that may be implemented in the processing system of FIG. 1 in accordance with selected embodiments of the invention.

FIG. 7 illustrates a block diagram of yet another defect aggregation circuit 700 (which may also be referred to as fault aggregation circuit 700) that may be implemented as part of fault detection circuitry 130 in processing system 100 of FIG. 1 in accordance with selected embodiments of the invention. Fault aggregation circuit 700 includes OR gate 702 and flip-flop 704. OR gate 702 includes as many inputs as there are fault detection circuits 132-140. Each input of OR gate 702 receives the Detect_out(n) signal from a corresponding one of the fault detection circuits 132-140 shown in FIG. 3. The output of OR gate 702 is provided to a clock input of flip-flop 704. A data input of flip-flop 704 is connected to a power supply ("1" denoting a HIGH), and an inverse reset input of flip-flop 704 receives the power on reset signal POR. The output of flip-flop 704 is the data input fault indicator signal IPP_IND_FLT that can be provided to bus masters 102-108 (FIG. 1). Software in bus masters 102-108 can allow the fault indicator signal IPP_IND_FLT to override the data input indicator signal from an I/O pad and corrective measures can be taken when a fault is detected. Additional circuitry can be included to register which of the fault detection circuits 132-140 registered the fault. The fault can be latched until the next power on reset cycle. In such an implementation, software can detect a high state on IPP_IND_FLT to detect a failure.

Figure 8:
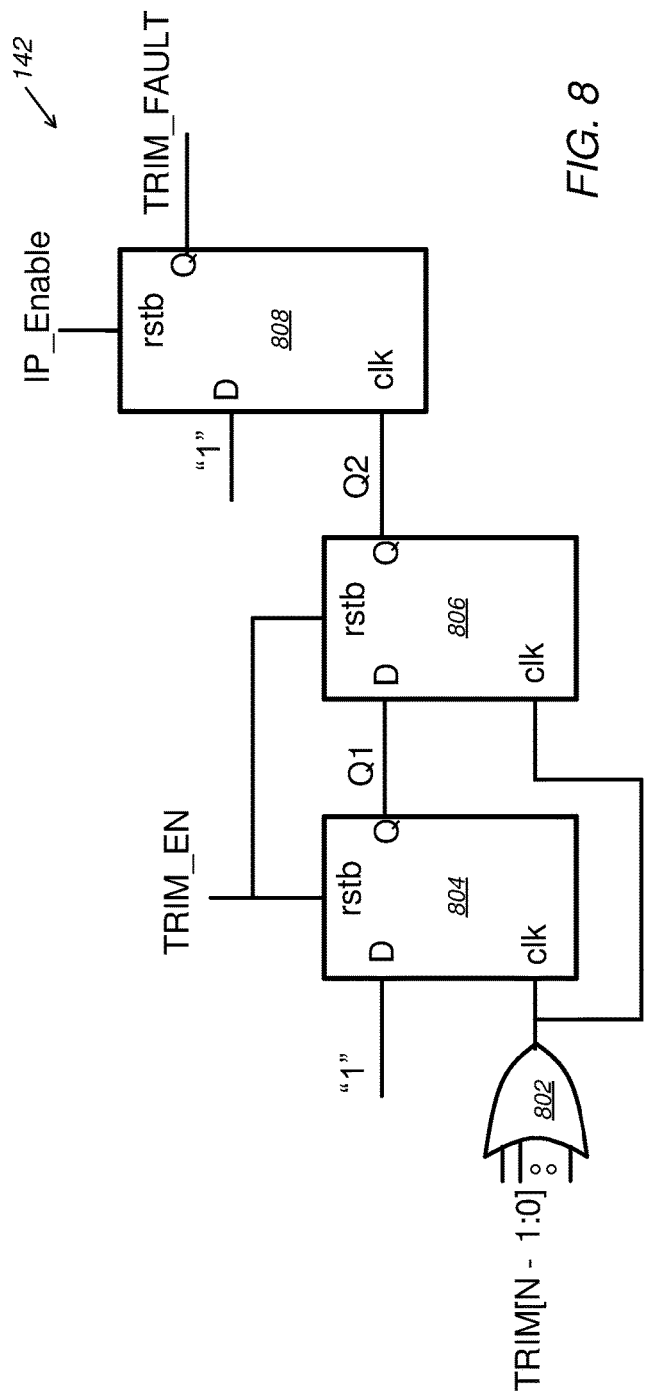
FIG. 8 illustrates a block diagram of a fault detection circuit for various trim signals that may be implemented in the processing system of FIG. 1 in accordance with selected embodiments of the invention.

FIG. 8 illustrates a block diagram of fault detection circuit 142 for various trim signals that may be implemented in processing system 100 of FIG. 1 in accordance with selected embodiments of the invention. An unexpected condition for trim signals can arise when a trim signal is toggling and a trim enable signal is high. The trim signals can be designed to be stable before the trim enable signal is set high. Therefore, when trim signals toggle after the trim enable signal goes high, a defect may be present. Trim signals are typically routed over long distances since they originate from non-volatile memory and do not change, or change very infrequently, and are therefore not timing critical. Most of the other controls of the analog I/O circuitry is from local digital circuits and therefore does not need explicit protection.

Fault detection circuit 142 includes OR gate 802 and flip-flops 804, 806 and 808. A number of trim signals are provided to a number of corresponding inputs to OR gate 802. The output of OR gate 802 is provided as a clock input to flip-flop 804. A data input of flip-flop 804 is connected to a power supply ("1" denoting a HIGH) and an inverse reset input to flip-flop 804 is coupled to the trim enable signal TRIM_EN. The output of flip-flop 804 is provided to the data input of flip-flop 806. The output of OR gate 802 is provided to the clock input of flip-flop 806. The trim enable signal is provided to the inverse reset input of flip-flop 806. The output of flip-flop 806 is provided to the clock input of flip-flop 808. Data input of flip-flop 808 is connected to a power supply ("1" denoting a HIGH) and an IP_Enable signal is provided to the inverse reset input of flip-flop 808. The IP_Enable signal can be asserted through software when the analog I/O circuitry is enabled. The output of flip-flop 808 is a TRIM_FAULT signal that indicates whether any of the trim signals were toggling while the trim enable signal TRIM_EN was high.

Figure 9:
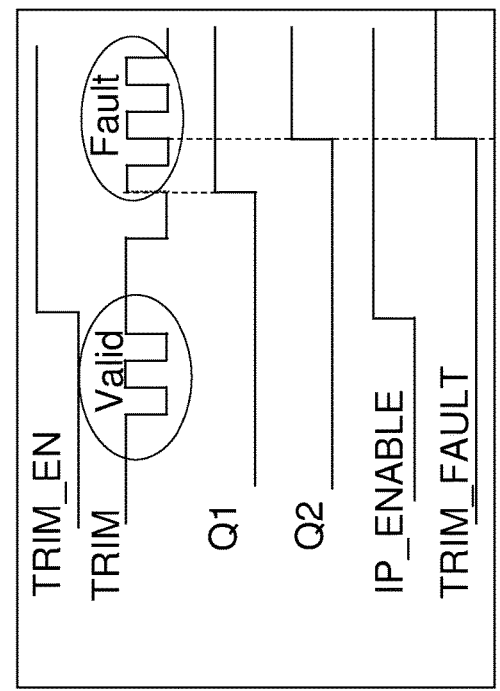
FIG. 9 illustrates an example of time history graphs for signals in the trim fault detection circuit of FIG. 8.

Referring to FIGS. 8 and 9, FIG. 9 illustrates an example of time history graphs for signals in trim fault detection circuit 142 during various stages of operation. When the trim enable signal TRIM_EN and the IP_enable signal are low, flip-flops 804, 806, and 808 are in a reset state and their output signals Q1, Q2, and TRIM_FAULT are low even when trim signals toggle. When the IP_ENABLE signal goes high, followed by the trim enable signal TRIM_EN going high, the output of flip-flop 804 Q1 goes high upon the first toggle of a trim signal input, and the output of flip-flop 806 Q2 goes high at a second toggle of the trim signal. This causes the output of flip-flop 808 to go high, setting the trim fault signal TRIM_FAULT to high. The output of flip-flop 808 can be provided to bus masters 102-108 (FIG. 1) to take corrective action. Additional circuitry can be included to register which of the trim signals registered the trim fault. The trim fault signal can be latched until the next power on reset cycle. For some SoCs with low power modes, trim signals could toggle after the trim enable signal goes high after recovering from low power mode. In this case, a standby mode state can be provided to the inverse reset input to flip flops 804-808.

By now it should be appreciated that processing systems, integrated circuits, and methods has been described that specifically target faults due to open/short circuits or programming errors or software malfunctions due to aging, coupling between traces, etc. Fault detection circuitry 130 uses digital circuits to detect unexpected or forbidden sequences in signals/configurations to indicate whether a fault occurred, without incurring a large area or time penalty.

In some embodiments, an integrated circuit can comprise an input/output (I/O) circuit configured to receive a first signal and a second signal, the I/O circuit can comprise an I/O terminal, an I/O buffer (output driver or input buffer), and a pull resistor (pull up or pull down) having a first terminal coupled to the I/O terminal. A fault detection circuit can be configured to determine whether a predetermined number of toggles of the first signal occurs while the second signal is held at a constant logic state. The fault detection circuit is configured to assert a fault indicator (e.g. detect_out) when the predetermined number of toggles occurs and negate the fault indicator when the predetermined number of toggles does not occur.

In another aspect, the I/O buffer can be characterized as an output buffer and the pull resistor has a second terminal coupled to a first voltage supply terminal (VDD or VSS).

In another aspect, the first signal can be a pull enable signal which selectively enables the pull resistor by providing a current path between the I/O terminal and the first voltage supply terminal, and the second signal can be an output buffer enable signal which selectively enables the output buffer.

In another aspect, the output buffer enable signal can be held at its asserted state which enables the output buffer (e.g., 3rd line of Table 1).

In another aspect, the pull resistor can be configured as a pull-up resistor, and the I/O circuit can be configured to receive an output buffer enable signal which selectively enables the output buffer, a pull enable signal (PUE), a pull select signal (PUS), an input buffer enable signal (IBE). The I/O circuit can further comprise an input buffer, wherein the input buffer enable signal selectively enables the input buffer; and a pull-down resistor having a first terminal coupled to the I/O terminal and a second terminal coupled to a second voltage supply terminal, which provides a supply voltage lower than a voltage supplied by the first voltage supply terminal. The pull-down enable signal can selectively enable the pull-down resistor, wherein the pull enable signal can enable one of the pull-up or pull-down resistors based on the pull select signal.

In another aspect, the first signal can be selected from a group consisting of the output buffer enable signal (OBE), the input buffer enable signal (IBE), the pull enable signal (PUE), the pull select signal (PUS), or a data input from the input buffer (IPP_DO), and the second signal can be a different signal selected from a group consisting of the output buffer enable signal (OBE), the input buffer enable signal (IBE), the pull enable signal (PUE), the pull select signal (PUS), or a data input from the input buffer (IPP_DO).

In another aspect, the first signal can be the pull select signal, and the second signal can be the pull enable signal, in which the pull enable signal can be held at its negated state which disables the pull-up and pull-down resistors (e.g., 2nd line of Table 1).

In another aspect, the first signal can be the input data from the input buffer, and the second signal can be the output buffer enable signal, in which the output buffer enable signal can be held at its negated state which disables the output buffer (e.g., 1st line of Table 1).

In another aspect, the first signal can be the output buffer enable signal, and the second signal can be the input data from the input buffer, in which the input data from the input buffer is held at a logic level low (e.g., 4th line of Table 1).

In another aspect, the first signal B can be the input buffer enable signal, and the second signal is the output buffer enable signal, in which the output buffer enable signal is held at its asserted state which enables the output buffer (e.g., 5th line of Table 1).

In another aspect, the fault detection circuit can comprise a first flip flop configured to receive a reset signal based on the second signal at a reset input of the first flip flop, to receive a clock signal based on the first signal at a clock input of the first flip flop, and to provide an output at a data output of the first flip flop; and a second flip flop configured to receive the reset signal based on the second signal at a reset input of the second flip flop, to receive the clock signal based on the first signal at a clock input of the second flip flop, to receive the output from the first flip flop at a data input of the second flip flop, and to provide a fault detection indicator at a data output, wherein the fault indicator is based on the fault detection indicator.

In other selected embodiments, an integrated circuit can comprise a circuit block including at least one of an input/output (I/O) circuit or an analog circuit; a digital circuit block located outside the circuit block; a set of control signals generated by the digital circuit block and received at the circuit block via an interface between the circuit block and the digital circuit block, wherein the set of control signals includes a first control signal and a second control signal; and fault detection circuitry configured to determine whether a predetermined number of toggles of the first control signal occurred while the second control signal is held at a constant logic state, and selectively assert a fault indicator (e.g. detect_out, defect_detected, or IPP_IND).

In another aspect, the fault detection circuitry can comprise a first flip flop configured to receive a reset signal based on the second control signal at a reset input (rst) of the first flip flop, to receive a clock signal based on the first control signal at a clock input of the first flip flop, and to provide an output at a data output (Q) of the first flip flop; and a second flip flop configured to receive the reset signal based on the second control signal at a reset input (rst) of the second flip flop, to receive the clock signal based on the first control signal at a clock input of the second flip flop, to receive the output from the first flip flop at a data input (D) of the second flip flop, and to provide a first fault detection indicator (e.g. detect_out) at a data output of the second flip flop.

In another aspect, the set of control signals generated by the digital circuit block can include a third control signal and a fourth control signal, the fault detection circuitry configured to selectively assert the fault indicator based on detecting that a predetermined number of toggles of the third control signal occurred while the fourth control signal is held at a second constant logic state, wherein the fault detection circuitry can further comprise: a third flip flop configured to receive a reset signal based on the fourth control signal at a reset input of the third flip flop, to receive a clock signal based on the third control signal at a clock input of the third flip flop, and to provide an output at a data output of the third flip flop; and a fourth flip flop configured to receive the reset signal based on the fourth control signal at a reset input of the fourth flip flop, to receive the clock signal based on the third control signal at a clock input of the fourth flip flop, to receive the output from the third flip flop at a data input of the fourth flip flop, and to provide a second fault detection indicator at a data output of the fourth flip flop.

In another aspect, the fault detection circuitry can be configured to selectively assert the fault indicator (e.g. defect_detected or IPP_IND) based on the first fault detection indicator and the second fault detection indicator.

In another aspect, the first and second fault detection indicators can be gated by a mode indicator (e.g. TEST), such that when the mode indicator has a first value, the fault indicator is selectively asserted by the fault detection circuitry based on the first fault detection indicator and the second fault detection indicator, and when the mode indicator has a second value, the fault indicator has a predetermined value, regardless of the values of the first and second fault detection indicators.

In another aspect, a data input (D) of the first flip flop can be configured to receive a predetermined logic level (e.g. logic level high).

In another aspect, the circuit block can include the I/O circuit, the I/O circuit can have an I/P terminal, an input buffer coupled to the I/O terminal, an output buffer coupled to the I/O terminal, and a pull resistor coupled between the I/O terminal and a power supply terminal. The first control signal is selected from a group consisting of an output buffer enable signal (OBE), an input buffer enable signal (IBE), a pull enable signal (PUE), a pull select signal (PUS), or a data input from the input buffer (IPP_DO), and the second signal is a different signal selected from a group consisting of the output buffer enable signal (OBE), the input buffer enable signal (IBE), the pull enable signal (PUE), the pull select signal (PUS), or a data input from the input buffer (IPP_DO).

In another aspect, the circuit block can include the analog circuit configured to selectively use one or more trim values based on a trim enable signal. The first control signal can be based on the one or more trim values (TRIM[N−1:0]), and the second control signal can be the trim enable signal (trim_en).

In a another aspect, the fault detection circuitry can comprise a first flip flop configured to receive a reset signal based on the trim enable signal at a reset input (rst) of the first flip flop, to receive a clock signal based on the one or more trim value at a clock input of the first flip flop, and to provide an output at a data output (Q1) of the first flip flop. A second flip flop can be configured to receive the reset signal based on the trim enable signal at a reset input (rst) of the second flip flop, to receive the clock signal based on the one or more trim values at a clock input of the second flip flop, to receive the output from the first flip flop at a data input (D) of the second flip flop, and to provide an output at a data output (Q2) of the second flip flop. A third flip flop can be configured to receive an enable signal at a reset input of the third flip flop, the output from the data output of the second flip flop at a clock input of the third flip flop, and to provide the fault indicator (e.g. trim_fault) at an output of the third flip flop.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   an input/output (I/O) circuit configured to receive a first signal and a second signal, the I/O circuit comprising:
      an I/O terminal,
      an I/O buffer characterized as an output buffer, and
      a pull resistor having a first terminal coupled to the I/O terminal and a second terminal coupled to a first voltage supply terminal; and
   a fault detection circuit configured to determine whether a predetermined number of toggles of the first signal occurs while the second signal is held at a constant logic state, wherein the fault detection circuit is configured to assert a fault indicator when the predetermined number of toggles occurs and negate the fault indicator when the predetermined number of toggles does not occur,
   wherein the first signal is a pull enable signal which selectively enables the pull resistor by providing a current path between the I/O terminal and the first voltage supply terminal, and the second signal is an output buffer enable signal which selectively enables the output buffer and is held at its asserted state which enables the output buffer.

2. An integrated circuit comprising:
   an input/output (I/O) circuit configured to receive a first signal and a second signal, the I/O circuit comprising:
      an I/O terminal,
      an I/O buffer characterized as an output buffer, and
      a pull resistor having a first terminal coupled to the I/O terminal and a second terminal coupled to a first voltage supply terminal; and
   a fault detection circuit configured to determine whether a predetermined number of toggles of the first signal occurs while the second signal is held at a constant logic state, wherein the fault detection circuit is configured to assert a fault indicator when the predetermined number of toggles occurs and negate the fault indicator when the predetermined number of toggles does not occur,
   wherein the pull resistor is configured as a pull-up resistor, and wherein the I/O circuit is configured to receive an output buffer enable signal which selectively enables the output buffer, a pull enable signal, a pull select signal, an input buffer enable signal, and further comprises:
      an input buffer, wherein the input buffer enable signal selectively enables the input buffer; and
      a pull-down resistor having a first terminal coupled to the I/O terminal and a second terminal coupled to a second voltage supply terminal, which provides a supply voltage lower than a voltage supplied by the first voltage supply terminal, wherein a pull-down enable signal selectively enables the pull-down resistor, wherein the pull enable signal enables one of the pull-up or pull-down resistors based on the pull select signal.

3. The integrated circuit of claim 2, wherein the first signal is selected from a group consisting of the output buffer enable signal, the input buffer enable signal, the pull enable signal, the pull select signal, or a data input from the input buffer, and the second signal is a different signal selected from a group consisting of the output buffer enable signal, the input buffer enable signal, the pull enable signal, the pull select signal, or a data input from the input buffer.

4. The integrated circuit of claim 3, wherein the first signal is the pull select signal, and the second signal is the pull enable signal, in which the pull enable signal is held at its negated state which disables the pull-up and pull-down resistors.

5. The integrated circuit of claim 3, wherein the first signal is the input data from the input buffer, and the second signal is the output buffer enable signal, in which the output buffer enable signal is held at its negated state which disables the output buffer.

6. The integrated circuit of claim 3, wherein the first signal is the output buffer enable signal, and the second signal is the input data from the input buffer, in which the input data from the input buffer is held at a logic level low.

7. The integrated circuit of claim 3, wherein the first signal is the input buffer enable signal, and the second signal is the output buffer enable signal, in which the output buffer enable signal is held at its asserted state which enables the output buffer.

8. An integrated circuit comprising:
   an input/output (I/O) circuit configured to receive a first signal and a second signal, the I/O circuit comprising:
      an I/O terminal,
      an I/O buffer, and
      a pull resistor having a first terminal coupled to the I/O terminal; and
   a fault detection circuit configured to determine whether a predetermined number of toggles of the first signal occurs while the second signal is held at a constant logic state, wherein the fault detection circuit is configured to assert a fault indicator when the predetermined number of toggles occurs and negate the fault indicator when the predetermined number of toggles does not occur,
   wherein the fault detection circuit comprises:
      a first flip flop configured to receive a reset signal based on the second signal at a reset input of the first flip flop, to receive a clock signal based on the first signal at a clock input of the first flip flop, and to provide an output at a data output of the first flip flop; and
      a second flip flop configured to receive the reset signal based on the second signal at a reset input of the second flip flop, to receive the clock signal based on the first signal at a clock input of the second flip flop, to receive the output from the first flip flop at a data input of the second flip flop, and to provide a fault detection indicator at a data output, wherein the fault indicator is based on the fault detection indicator.

9. An integrated circuit, comprising:
a circuit block including at least one of an input/output (I/O) circuit or an analog circuit;
a digital circuit block located outside the circuit block;
a set of control signals generated by the digital circuit block and received at the circuit block via an interface between the circuit block and the digital circuit block, wherein the set of control signals includes a first control signal and a second control signal; and
fault detection circuitry configured to determine whether a predetermined number of toggles of the first control signal occurred while the second control signal is held at a constant logic state, and selectively assert a fault indicator, wherein the fault detection circuitry comprises:
a first flip flop configured to receive a reset signal based on the second control signal at a reset input of the first flip flop, to receive a clock signal based on the first control signal at a clock input of the first flip flop, and to provide an output at a data output of the first flip flop; and
a second flip flop configured to receive the reset signal based on the second control signal at a reset input of the second flip flop, to receive the clock signal based on the first control signal at a clock input of the second flip flop, to receive the output from the first flip flop at a data input of the second flip flop, and to provide a first fault detection indicator at a data output of the second flip flop.

10. The integrated circuit of claim 9, wherein the set of control signals generated by the digital circuit block includes a third control signal and a fourth control signal, the fault detection circuitry configured to selectively assert the fault indicator based on detecting that a predetermined number of toggles of the third control signal occurred while the fourth control signal is held at a second constant logic state, wherein the fault detection circuitry further comprises:
a third flip flop configured to receive a reset signal based on the fourth control signal at a reset input of the third flip flop, to receive a clock signal based on the third control signal at a clock input of the third flip flop, and to provide an output at a data output of the third flip flop; and
a fourth flip flop configured to receive the reset signal based on the fourth control signal at a reset input of the fourth flip flop, to receive the clock signal based on the third control signal at a clock input of the fourth flip flop, to receive the output from the third flip flop at a data input of the fourth flip flop, and to provide a second fault detection indicator at a data output of the fourth flip flop.

11. The integrated circuit of claim 10, wherein the fault detection circuitry is configured to selectively assert the fault indicator based on the first fault detection indicator and the second fault detection indicator.

12. The integrated circuit of claim 10, wherein the first and second fault detection indicators are gated by a mode indicator, such that when the mode indicator has a first value, the fault indicator is selectively asserted by the fault detection circuitry based on the first fault detection indicator and the second fault detection indicator, and when the mode indicator has a second value, the fault indicator has a predetermined value, regardless of the values of the first and second fault detection indicators.

13. The integrated circuit of claim 9, wherein a data input of the first flip flop is configured to receive a predetermined logic level.

14. The integrated circuit of claim 9, wherein:
the circuit block includes the I/O circuit, the I/O circuit having an I/O terminal, an input buffer coupled to the I/O terminal, an output buffer coupled to the I/O terminal, and a pull resistor coupled between the I/O terminal and a power supply terminal,
the first control signal is selected from a group consisting of an output buffer enable signal, an input buffer enable signal, a pull enable signal, a pull select signal, or a data input from the input buffer, and
the second signal is a different signal selected from a group consisting of the output buffer enable signal, the input buffer enable signal, the pull enable signal, the pull select signal, or a data input from the input buffer.

15. An integrated circuit, comprising:
a circuit block including an analog circuit configured to selectively use one or more trim values based on a trim enable signal;
a digital circuit block located outside the circuit block;
a set of control signals generated by the digital circuit block and received at the circuit block via an interface between the circuit block and the digital circuit block, wherein the set of control signals includes a first control signal and a second control signal, wherein the first control signal is based on the one or more trim values, and the second control signal is the trim enable signal; and
fault detection circuitry configured to determine whether a predetermined number of toggles of the first control signal occurred while the second control signal is held at a constant logic state, and selectively assert a fault indicator,
wherein the fault detection circuitry comprises:
a first flip flop configured to receive a reset signal based on the trim enable signal at a reset input of the first flip flop, to receive a clock signal based on the one or more trim value at a clock input of the first flip flop, and to provide an output at a data output of the first flip flop;
a second flip flop configured to receive the reset signal based on the trim enable signal at a reset input of the second flip flop, to receive the clock signal based on the one or more trim values at a clock input of the second flip flop, to receive the output from the first flip flop at a data input of the second flip flop, and to provide an output at a data output of the second flip flop, and
a third flip flop configured to receive an enable signal at a reset input of the third flip flop, the output from the data output of the second flip flop at a clock input of the third flip flop, and to provide the fault indicator at an output of the third flip flop.

* * * * *